(12) United States Patent
Robinson (10) Patent No.: US 9,048,616 B1
(45) Date of Patent: Jun. 2, 2015

(54) METHOD, SYSTEM AND APPARATUS FOR AUTOMATICALLY DETERMINING OPERATING CONDITIONS OF A PERIODICALLY POLED LITHIUM NIOBATE CRYSTAL IN A LASER SYSTEM

(71) Applicant: CHRISTIE DIGITAL SYSTEMS USA, INC., Cypress, CA (US)

(72) Inventor: Wayne Robinson, Kitchener (CA)

(73) Assignee: CHRISTIE DIGITAL SYSTEMS USA, INC., Cypress, CA (US)

( * ) Notice: Subject to any disclaimer, the term of this patent is extended or adjusted under 35 U.S.C. 154(b) by 0 days.

(21) Appl. No.: 14/086,538

(22) Filed: Nov. 21, 2013

(51) Int. Cl.
*H01S 3/04* (2006.01)
*H01S 3/10* (2006.01)
*H01S 3/108* (2006.01)
*H01S 3/109* (2006.01)
*H01S 5/024* (2006.01)

(52) U.S. Cl.
CPC . *H01S 3/04* (2013.01); *H01S 5/024* (2013.01); *H01S 3/0405* (2013.01); *H01S 3/10* (2013.01); *H01S 3/1003* (2013.01); *H01S 3/108* (2013.01); *H01S 3/109* (2013.01)

(58) Field of Classification Search
CPC .......... H01S 3/04; H01S 3/0405; H01S 3/10; H01S 3/1003; H01S 3/108; H01S 3/109

USPC ................................................ 372/21, 22, 34
See application file for complete search history.

(56) References Cited

U.S. PATENT DOCUMENTS

2009/0154509 A1\* 6/2009 Suzuki et al. ................... 372/22

\* cited by examiner

*Primary Examiner* — Armando Rodriguez
(74) *Attorney, Agent, or Firm* — Perry + Currier, Inc.

(57) ABSTRACT

A method, system and apparatus for automatically determining operating conditions of a periodically poled lithium niobate crystal in a laser system are provided. The system comprise: a laser; a periodic poled lithium niobate (PPLN) crystal for receiving laser input from the laser; a temperature control device for adjusting the temperature of the PPLN crystal; a temperature sensor for monitoring the temperature of the PPLN crystal; and a computing device. While the PPLN crystal is receiving laser input, temperature of the PPLN crystal is changed using the temperature control device. The computing device monitors the temperature of the PPLN crystal and corresponding power of the temperature control device during the changing, the temperature monitored using the temperature sensor. The computing device determines one or more of operating conditions of the temperature control device and an operating temperature of the PPLN crystal from a function of the power vs. the temperature.

18 Claims, 5 Drawing Sheets

While PPLN Crystal Is Receiving Laser Input From The Laser, Changing, Using The Temperature Control Device, A Temperature Of The PPLN Crystal
501

Monitoring The Temperature Of The PPLN Crystal And Corresponding Power Of The Temperature Control Device During The Changing, The Temperature Of The PPLN Crystal Monitored Using The Temperature Sensor
503

Determining One Or More Of Operating Conditions Of The Temperature Control Device And An Operating Temperature Of The PPLN Crystal From A Function Of The Power Vs. The Temperature
505

After One Or More Of The Operating Conditions Of The Temperature Control Device And The Operating Temperature Of The PPLN Have Been Determined, One Or More Of Operating The PPLN Crystal At The Operating Temperature And Operating The Temperature Control Device At The Operating Conditions
507

Fig. 5

METHOD, SYSTEM AND APPARATUS FOR AUTOMATICALLY DETERMINING OPERATING CONDITIONS OF A PERIODICALLY POLED LITHIUM NIOBATE CRYSTAL IN A LASER SYSTEM

FIELD

The specification relates generally to laser systems, and specifically to a method, system and apparatus for automatically determining operating conditions of a periodically poled lithium niobate crystal in a laser system.

BACKGROUND

In laser systems, such as extended cavity surface emitting laser (ECSEL) systems, the optimum laser optical power output is manually configured by setting the temperature of a periodically poled lithium niobate (PPLN) crystal to a value that maximized the optical power output from the laser device. This is an inherently inefficient process because the temperature is determined at one operating point for laser current and laser diode temperature which, in practice, changes over time. The change in the laser operating point changes the temperature of the PPLN crystal and hence the laser optical power output, generally in a direction of less optical power output. The process has to be repeated for other operating points, which is time consuming and prone to error.

SUMMARY

In general, this specification is directed to a laser system that includes a laser and a periodically poled lithium niobate (PPLN) crystal for controlling output of the laser, for example to achieve frequency doubling and the like. The temperature of the PPLN crystal is automatically adjusted using a temperature control device in order to tune the periodicity of the PPLN crystal. When the periodicity of the PPLN crystal is aligned with the wavelength of the laser, the output of the laser system is optimized. Otherwise, energy from the laser heats the PPLN crystal. Hence, if the power to a temperature control device, that controls the temperature of the PPLN crystal, is fixed, and the resulting temperature is not initially optimized, then the temperature of the PPLN crystal can drift, further degrading the output of the laser system. Hence, provided herein, is a method, system and apparatus for automatically determining operating conditions of a periodically poled lithium niobate crystal in a laser system.

In this specification, elements may be described as "configured to" perform one or more functions or "configured for" such functions. In general, an element that is configured to perform or configured for performing a function is configured to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XYY, YZ, ZZ, and the like). Similar logic can be applied for two or more items in any occurrence of "at least one . . . " and "one or more . . . " language.

An aspect of the present specification provides a method comprising: in a system comprising: a laser; a periodic poled lithium niobate (PPLN) crystal configured to receive laser input from the laser; a temperature control device configured to adjust the temperature of the PPLN crystal; a temperature sensor configured to monitor the temperature of the PPLN crystal; and a computing device: while the PPLN crystal is receiving laser input from the laser, changing, using the temperature control device, a temperature of the PPLN crystal; monitoring, at the computing device, the temperature of the PPLN crystal and corresponding power of the temperature control device during the changing, the temperature of the PPLN crystal monitored using the temperature sensor; and, determining, at the computing device, one or more of operating conditions of the temperature control device and an operating temperature of the PPLN crystal from a function of the power vs. the temperature.

The function can comprise a slope corrected function of the power vs. the temperature, a constant trend for heating the PPLN crystal one or more of separated and subtracted from the power vs. the temperature.

Determining one or more of the operating conditions of the temperature control device and the operating temperature of the PPLN crystal from the function of the power vs. the temperature can comprise: one or more of separating and subtracting a constant trend for heating the PPLN crystal from the power vs. the temperature to produce slope-corrected power vs. temperature data; and, finding one or more of a peak, a maximum and an inflection point in a slope of the slope-corrected power vs. temperature data, the operating conditions of the temperature control device and the operating temperature corresponding to one or more of the peak, the maximum, and the inflection point.

The function can comprise a sinc 2 function.

The method can further comprise: after one or more of the operating conditions of the temperature control device and the operating temperature of the PPLN crystal have been determined, one or more of operating the PPLN crystal at the operating temperature and operating the temperature control device at the operating conditions. The method can further comprise: continuing to monitor the temperature of the PPLN crystal and the corresponding power of the temperature control device, and continuing to determine the function of the power vs. the temperature; and, when a slope of the function changes from a pre-determined slope, adjusting one or more of the operating conditions of the temperature control device and the temperature of the PPLN crystal until the slope changes back to the pre-determined slope. The function can comprise a slope corrected function of the power vs. the temperature, a constant trend for heating the PPLN crystal one or more of separated and subtracted from the power vs. the temperature, and the pre-determined slope can comprise a zero slope.

Changing the temperature can comprise one or more of: dithering the temperature about a given temperature; and sweeping the temperature through a given range. The method can further comprise determining one or more of the given temperature and the given range from one or more of: factory settings for the PPLN crystal; a previous operating temperature of the PPLN crystal; and, previous operating conditions for the temperature control device.

Another aspect of the present specification provides a system comprising: a laser; a periodic poled lithium niobate (PPLN) crystal configured to receive laser input from the laser; a temperature control device configured to adjust the temperature of the PPLN crystal; a temperature sensor configured to monitor the temperature of the PPLN crystal; and, a computing device configured to: while the PPLN crystal is receiving laser input from the laser, change, using the temperature control device, a temperature of the PPLN crystal; monitor the temperature of the PPLN crystal and corresponding power of the temperature control device during changing of the temperature, the temperature of the PPLN crystal monitored using the temperature sensor; and, determine one or more of operating conditions of the temperature control device and an operating temperature of the PPLN crystal from a function of the power vs. the temperature.

The function can comprise a slope corrected function of the power vs. the temperature, a constant trend for heating the PPLN crystal one or more of separated and subtracted from the power vs. the temperature.

The computing device can be further configured to determine one or more of the operating conditions of the temperature control device and the operating temperature of the PPLN crystal from the function of the power vs. the temperature by: one or more of separating and subtracting a constant trend for heating the PPLN crystal from the power vs. the temperature to produce slope-corrected power vs. temperature data; and, finding one or more of a peak, a maximum, and an inflection point in a slope of the slope-corrected power vs. temperature data, the operating conditions of the temperature control device and the operating temperature corresponding to one or more the peak, the maximum, and the inflection point.

The function can comprise a sinc 2 function.

The computing device can be further configured to: after one or more of the operating conditions of the temperature control device and the operating temperature of the PPLN crystal have been determined, one or more of operate the PPLN crystal at the operating temperature and operate the temperature control device at the operating conditions. The computing device can be further configured to: continue to monitor the temperature of the PPLN crystal and the corresponding power of the temperature control device, and continue to determine the function of the power vs. the temperature; and, when a slope of the function changes from a predetermined slope, adjust one or more of the operating conditions of the temperature control device and the temperature of the PPLN crystal until the slope changes back to the pre-determined slope. The function can comprise a slope corrected function of the power vs. the temperature, a constant trend for heating the PPLN crystal one or more of separated and subtracted from the power vs. the temperature, and the pre-determined slope can comprise a zero slope.

The computing device can be further configured to change the temperature by one or more of: dithering the temperature about a given temperature; and sweeping the temperature through a given range. The computing device can be further configured to determine one or more of the given temperature and the given range from one or more of: factory settings for the PPLN crystal; a previous operating temperature of the PPLN crystal; and, previous operating conditions for the temperature control device.

The system can further comprise an output coupler, wherein the laser can comprise an extended cavity surface emitting laser, the PPLN crystal located between the laser and the output coupler.

A further aspect of the specification provides a computer program product, comprising a computer usable medium having a computer readable program code adapted to be executed to implement a method comprising: in a system comprising: a laser; a periodic poled lithium niobate (PPLN) crystal configured to receive laser input from the laser; a temperature control device configured to adjust the temperature of the PPLN crystal; a temperature sensor configured to monitor the temperature of the PPLN crystal: while the PPLN crystal is receiving laser input from the laser, changing, using the temperature control device, a temperature of the PPLN crystal; monitoring the temperature of the PPLN crystal and corresponding power of the temperature control device during the changing, the temperature of the PPLN crystal monitored using the temperature sensor; and, determining one or more of operating conditions of the temperature control device and an operating temperature of the PPLN crystal from a slope of a function of the power vs. the temperature. The computer usable medium can comprise a non-transitory computer usable medium.

BRIEF DESCRIPTIONS OF THE DRAWINGS

For a better understanding of the various implementations described herein and to show more clearly how they may be carried into effect, reference will now be made, by way of example only, to the accompanying drawings in which.

DETAILED DESCRIPTION

Figure 1:
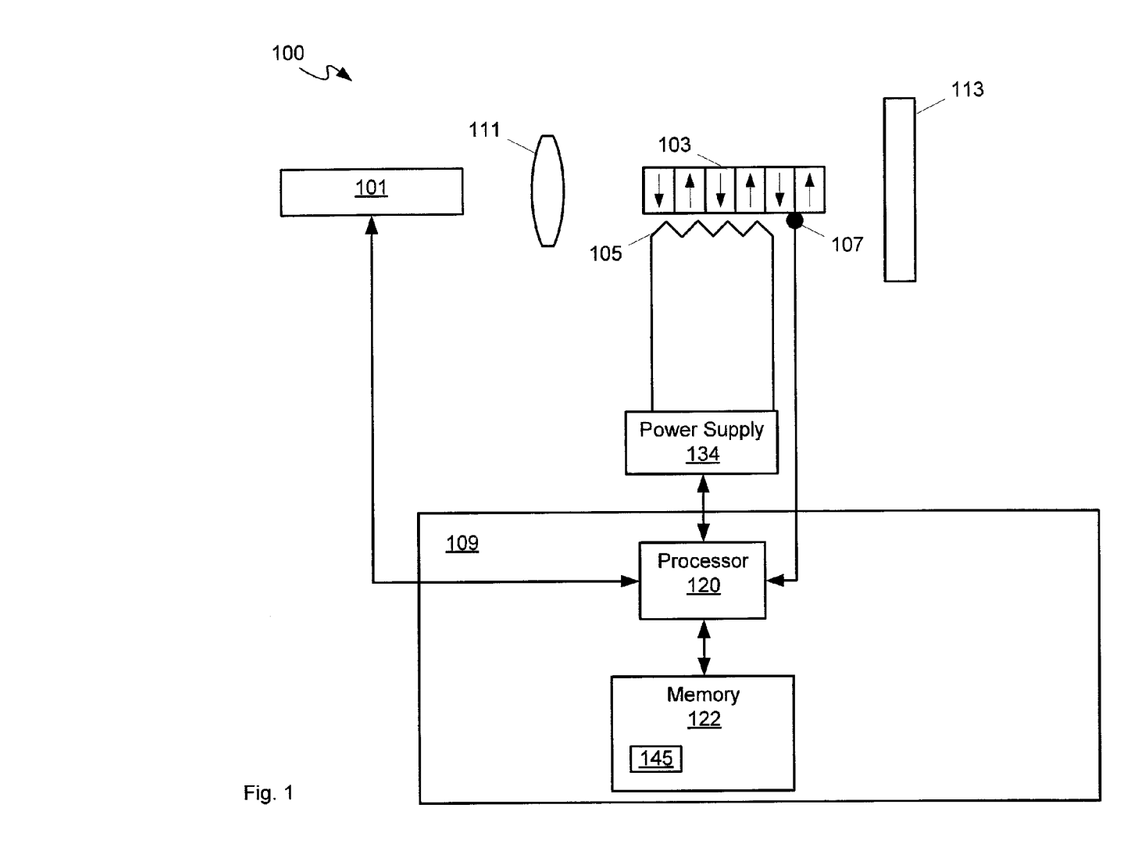
FIG. 1 depicts a system for determining operating conditions of a periodically poled lithium niobate crystal in a laser system, according to non-limiting implementations.

FIG. 1 depicts a system 100 comprising a laser 101; a periodic poled lithium niobate (PPLN) crystal 103 configured to receive laser input from laser 101; a temperature control device 105 configured to adjust the temperature of PPLN crystal 103; a temperature sensor 107 configured to monitor the temperature of PPLN crystal 103; and, a computing device 109 configured to: while PPLN crystal 103 is receiving laser input from laser 101, change, using temperature control device 105, a temperature of PPLN crystal 103; monitor the temperature of PPLN crystal 103 and corresponding power of temperature control device 105 during changing of the temperature, the temperature of PPLN crystal 103 monitored using temperature sensor 107; and, determine one or more of operating conditions of temperature control device 105 and an operating temperature of PPLN crystal 103 a function of the power vs. the temperature.

Computing device 109 can be configured to change the temperature by one or more of: dithering the temperature about a given temperature; and sweeping the temperature through a given range. The computing device 109 can be further configured to determine one or more of the given temperature and the given range from one or more of: factory settings for PPLN crystal 103; a previous operating temperature of PPLN crystal 103; and, previous operating conditions for temperature control device 105. However, other processes for changing the temperature are within the scope of present implementations.

System 100 can further comprise one or more lenses 111 configured to focus laser output from laser 101 onto an input of PPLN crystal 103 (i.e. as laser input to PPLN crystal 103). System 100 can further comprise an output coupler 113 configured to extract at least a portion of the laser output from the combination of laser 101 and PPLN crystal 103, PPLN crystal 103 generally located between laser 101 and output coupler 113.

The combination of laser 101, one or more lenses 111, PPLN crystal 103, and output coupler 113 generally comprises a laser system that can be incorporated into a single device, including, but not limited to, an extended cavity surface emitting laser (ECSEL) system, a diode laser system, and the like.

Computing device 109 generally comprises a processor 120 interconnected with a memory 122. Processor 120 is generally configured to: communicate with and/or control a power supply 134 configured to supply power to temperature control device 105; and communicate with temperature sensor 107. Communication with power supply 134 and/or temperature sensor 107 can occur using any suitable wired and/or wireless link there between. As depicted, power supply 134 is external to computing device 109, and in communication with processor 120 via another input of computing device 109. However, in other implementations, power supply 134 can be internal to computing device 109.

In some implementations, as depicted, processor 120 can further be in communication with laser 101 to control laser 101, for example, to turn on and/or off and/or control power of laser 101 and/or a wavelength of laser 101.

Laser 101 can comprise one or more of an ECSEL, and a diode laser, however other lasers, that can function using PPLN crystal 103, are within the scope of present implementations.

PPLN crystal 103 is generally configured to receive laser input from laser 101 and, when the periodicity of PPLN crystal 103 is tuned to the wavelength of the laser input, the PPLN crystal 103 changes the laser input to a shorter wavelength, so the output of system 100 (i.e. from output coupler 113) comprises laser light that is of a shorter wavelength then the frequency of laser light received at PPLN crystal 103 from laser 101; for example, frequency doubling, and the like, can occur at PPLN crystal 103. The periodicity of PPLN crystal 103 changes with temperature, however, so that the periodicity of PPLN crystal 103 can be tuned by changing a temperature of PPLN crystal 103, for example, using temperature control device 105.

Temperature control device 105 can comprise one or more of a heater, a cooler, a resistor, a thermoelectric heater, a heating circuit, and the like, located adjacent and/or proximal PPLN crystal 103. Temperature control device 105 is generally powered by power supply 134 under control of processor 120. Power supply 134 hence comprises a power supply, a power source, and the like, configured to power temperature control device 105.

Temperature sensor 107 can comprise one or more of a thermocouple, thermisters, and the like, located adjacent and/or proximal PPLN crystal 103. Specifically, temperature sensor 107 is located to sense a temperature of PPLN crystal 103; temperature sensor 107 is hence generally configured to sense a temperature of PPLN crystal 103. One or more of a signal, and data, from temperature sensor 107 is monitored by processor 120 so that processor 120 can determine and/or monitor a temperature of PPLN crystal 103 at any given time.

In some implementations, one or more of temperature control device 105 and temperature sensor 107 can be integrated with PPLN crystal 103, for example as PPLN control circuits.

Processor 120 is configured to control operating conditions of temperature control device 105, such as a power output to temperature control device 105, and determine a corresponding temperature of PPLN crystal 103 using temperature sensor 107. For example, in operation, processor 120 controls power supply 134 to output power to temperature control device 105 to control a temperature of PPLN crystal 103, which can be monitored using temperature sensor 107; hence, processor 120 can control the temperature of PPLN crystal 103 in a feedback loop with temperature control device 105 (and/or power supply 134).

Processor 120 can determine and/or monitor a temperature of PPLN crystal 103 periodically and/or at given intervals and/or at given times, and the like.

It is appreciated that FIG. 1 further depicts a schematic diagram of computing device 109, which will be hereafter be described in further detail. It should be emphasized that the structure of computing device 109 in FIG. 1 is purely an example. For example, as depicted in FIG. 1, it is contemplated that computing device 109 comprises a device that can be used for controlling system 100, as well as any other specialized functions, including, but not limited, to one or more of, computing, email, messaging network connectivity and the like.

While not depicted, computing device 109 can include at least one input device generally configured to receive input data, and can comprise any suitable combination of input devices, including but not limited to a keyboard, a keypad, a pointing device, a mouse, a track wheel, a trackball, a touchpad, a touch screen and the like. Other input devices are within the scope of present implementations.

Input from input device can be received at processor 120 (which can be implemented as a plurality of processors, including but not limited to one or more central processors (CPUs). Processor 120 is configured to communicate with a memory 122 comprising a non-volatile storage unit (e.g. Erasable Electronic Programmable Read Only Memory ("EEPROM"), Flash Memory, and the like) and a volatile storage unit (e.g. random access memory ("RAM"), and the like). Programming instructions that implement the functional teachings of device 109 as described herein are typically maintained, persistently, in memory 122 and used by processor 120 which makes appropriate utilization of volatile storage during the execution of such programming instructions. In some implementations, processor 120 comprises at least a portion of memory 122, for example as on-board random access memory (RAM). It is further appreciated that memory 122 is an example of computer readable media that can store programming instructions executable on processor 120. Furthermore, memory 122 is also an example of a memory unit and/or memory module.

In particular, it is appreciated that memory 122 stores application 145, that, when processed by processor 120, enables processor 120 and/or computing device to: while PPLN crystal 103 is receiving laser input from laser 101, change, using temperature control device 105, a temperature of PPLN crystal 103; monitor the temperature of PPLN crystal 103 and corresponding power of temperature control device 105 during changing of the temperature, the temperature of PPLN crystal 103 monitored using temperature sensor 107; and, determine one or more of operating conditions of temperature control device 105 and an operating temperature of PPLN crystal 103 from a function of the power vs. the temperature.

Further, application 145 is an example of programming instructions executable on processor 120 and/or computer-readable program code for operation of computing device 109.

Processor 120 can be further configured to communicate with a display (not depicted), and optionally a microphone and/or a speaker (not depicted). Computing device 109 can further comprise a communication interface (not depicted)

can be implemented as one or more radios and/or connectors and/or network adaptors, configured to wirelessly communicate with one or more communication networks (not depicted) and/or wireless communication networks and/or wired communication networks and/or wireless transceivers.

While not depicted, it is yet further appreciated that device 109 comprises one or more of a connection to a mains power, a battery and/or a power pack, or any other suitable power source.

It should be understood that a wide variety of configurations for computing device 109 are contemplated.

In any event, system 100 works most efficiently to output laser light via output coupler 113 when PPLN crystal 103 is heated to a temperature where the periodicity of PPLN crystal 103 is tuned to the wavelength of laser 101. When the periodicity of PPLN crystal 103 is not tuned to the wavelength of laser 101, then energy from the laser input is not efficiently converted to laser output; rather at least a portion of the energy from the laser input is converted to heat at PPLN crystal 103. Hence, when PPLN crystal 103 is not converting laser input from laser 101 to laser output, the relationship between power of temperature control device 105 and temperature of PPLN crystal 103 is generally linear as heat from both temperature control device 105 and laser input from laser 101 heats PPLN crystal 103.

However, when PPLN crystal 103 is heated to a temperature where the periodicity of PPLN crystal 103 is tuned to the wavelength of laser 101, the relationship between power of temperature control device 105 and temperature of PPLN crystal 103 is not linear: as the periodicity of PPLN crystal 103 approaches a tuned periodicity, energy from the laser input is converted to laser output, which maximizes when the periodicity of PPLN crystal 103 is about tuned to the wavelength of laser 101, for example at an optimal temperature. As the temperature increases past the optimal temperature, more energy from the laser input is again converted to heat until a linear region again occurs where no energy from the laser input is converted to laser output. Hence, in the region where the periodicity of PPLN crystal 103 is tuned, and/or approaching being in tune, with the wavelength of laser 101, more power from temperature control device 105 PPLN crystal 103 is needed to heat PPLN crystal 103, relative to the linear regions.

Figure 2:
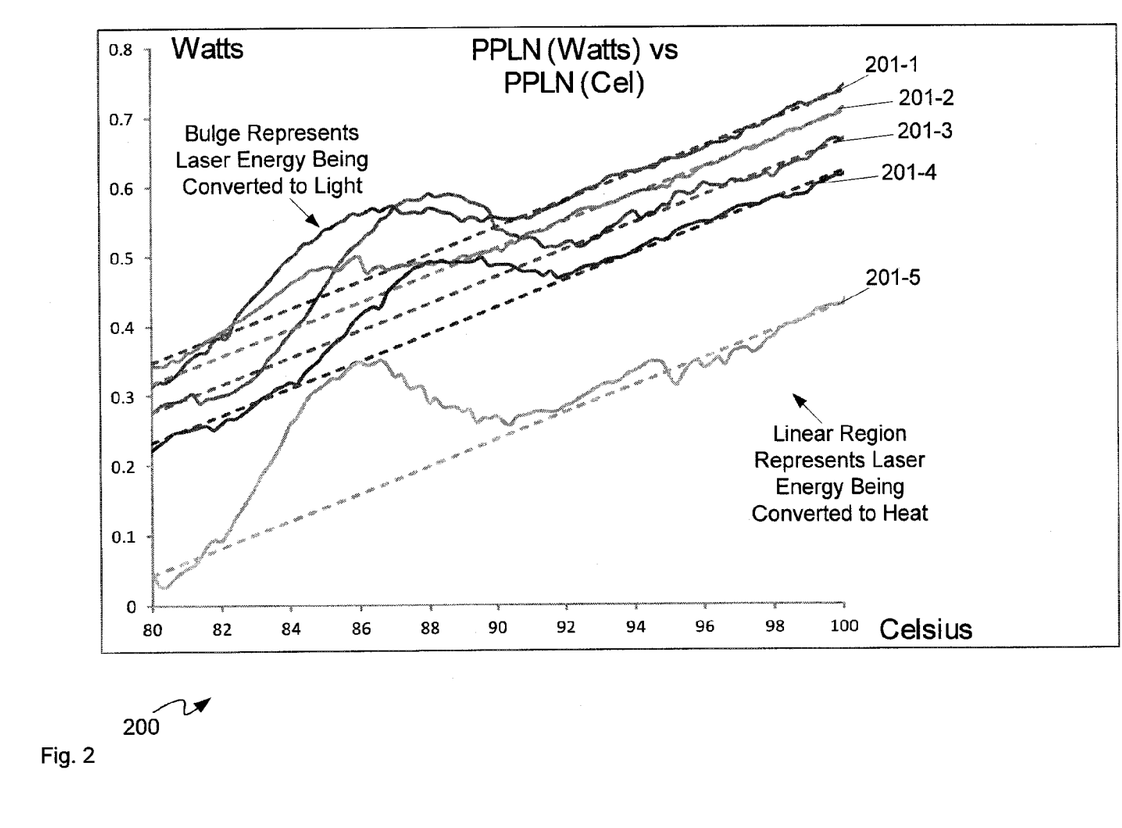
FIG. 2 depicts PPLN crystal heating power vs. PPLN crystal temperature curves for five different ECSEL laser systems, according to non-limiting implementations.

For example, attention is next directed to FIG. 2 which depicts a graph 200 of curves 201-1, 201-2, 201-3, 201-4, 201-5 of experimental results of power input to temperature control device 105, in Watts, as a function of temperature of PPLN crystal 103, in ° C., for five different ECSEL systems, each of the five different ECSEL systems comprising a respective laser 101 and a respective PPLN crystal 103. Curves 201-1, 201-2, 201-3, 201-4, 201-5 will be interchangeably referred to hereafter, collectively, as curves 201 and generically as a curve 201.

Processor 120 can acquire each curve 201 by changing the temperature of each PPLN crystal 103, for example through a given range of about 80° C. to about 100° C., by controlling power to temperature control device 105, and obtaining the temperature of PPLN crystal 103 for corresponding power output to temperature control device 105. The given range, however, can depend on a type of laser 101, a type of PPLN crystal 103, a wavelength of laser 101, and the like. For example, if a previous operating temperature of PPLN crystal 103 is known, and stored at memory 122, for example from a previous operation of system 100, then the range can be a few degrees (including, but not limited to, about 2° C. to about 10° C.) above and below the previous operating temperature.

Further, changing the temperature can include, but is not limited to: sweeping the temperature of PPLN crystal 103, for example through a given range, in discrete steps and/or continuously; and dithering the temperature about a given temperature, for example a previous operating temperature stored at memory 122. The given temperature can be stored at memory 122 during a previous operation of system 100 and/or provisioned at memory 122 at a factory. Dithering can include, but is not limited to, controlling the temperature of PPLN crystal 103 in discrete steps about the given temperature; and controlling the temperature of PPLN crystal 103 in any given order of temperature value (for example, in dithering, the temperature of PPLN crystal 103 can be raised and/or lowered in any order).

Each curve 201 is generally representative of how temperature of a respective PPLN crystal 103 changes as both power to a respective temperature control device 105 changes and as energy from respective laser input (from a respective laser 101) is absorbed and/or converted to laser output, at a respective PPLN crystal 103.

Each respective PPLN crystal 103 will absorb relatively more energy from a respective laser input away from a temperature where a periodicity of a respective PPLN crystal 103 is in tune with a wavelength of a respective laser 101; further, each respective PPLN crystal 103 will absorb relatively less energy from a respective laser input near to a temperature where a periodicity of a respective PPLN crystal 103 is in tune with a wavelength of a respective laser 101.

Hence, each curve 201 comprises at least one linear region, where the periodicity of a respective PPLN crystal 103 is not in tune with a wavelength of a respective laser 101 and heat from both temperature control device 105 and laser 101 is absorbed at PPLN crystal 103 without any substantial conversion of laser energy from laser 101 to laser output at PPLN crystal 103. In other words, in the linear region(s), as indicated on graph 200, the laser energy received at PPLN crystal 103 is converted to heat.

Hence, each curve 201 further shows a respective trend line (depicted in broken lines), which is indicative of a temperature increase due to both absorption of heat from temperature control device 105, and from laser input, in the absence of conversion of the laser input to laser output and/or optical output.

However, each curve 201 also has a non-linear region, the "bulges" indicated on graph 200 and described in further detail below, where the periodicity of a respective PPLN crystal 103 is at least partially in tune with a wavelength of a respective laser 101. In other words, in this region, as indicated on graph 200, the laser energy received at PPLN crystal 103 is converted to a combination of laser light and heat at PPLN crystal 103, with the most efficient optical conversion occurring at one or more of a peak and an inflection point of the bulge.

Figure 3:
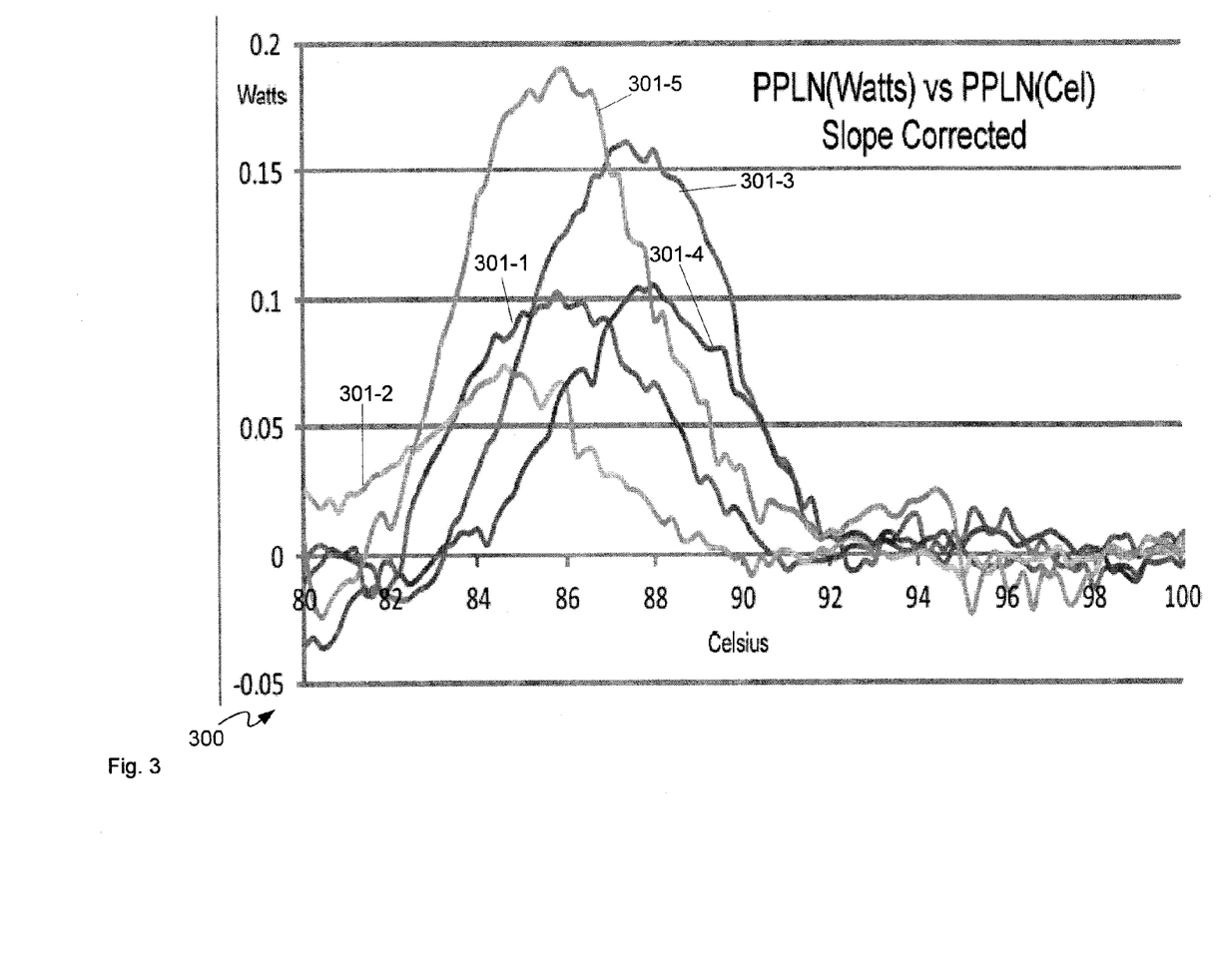
FIG. 3 depicts the curves of FIG. 2 corrected to remove trend lines, according to non-limiting implementations.

For example, attention is next directed to FIG. 3 which depicts a graph 300 of curves 301-1, 301-2, 301-3, 301-4, 301-5 which respectively correspond to curves 201-1, 201-2, 201-3, 201-4, 201-5 of FIG. 2, with the respective trend lines of one or more of separated and subtracted from each curve 201. Curves 301-1, 301-2, 301-3, 301-4, 301-5 will be interchangeably referred to hereafter, collectively, as curves 301 and generically as a curve 301. Analysis on each of curves 301 show that each curve 301 comprises a sinc 2 function (e.g. $(\sin(x)/x)^2$, where x is one or more of temperature and a function of temperature). In other words, each curve 201 comprises a sinc 2 function added to a linear function.

Processor 120 can hence be configured to produce curves 301 from curves 201 by determining the trend line for each curve 201 and one or more of separating and subtracting the trend line there from. The trend lines can be determined by processor 120 ignoring the bulges and determining a linear function for each liner region of each curve 201.

Processor 120 can then determine a power and corresponding temperature at each peak and/or inflection point of a respective sinc 2 function of each curve 301, the power and corresponding temperature of each peak and/or inflection point corresponding, respectively, to an operating temperature and operating conditions of temperature control device 105. Such a determination can occur by processor 120: determining a linear trend line for a curve 201; subtracting the linear trend line for the curve 201 to produce a respective curve 301; and, obtaining slope and/or a differential of the respective curve 301 to determine a position of the peak and/or inflection point where the slope is about zero, presuming the portions of each curve 301 away from each respective peak are ignored: in other words, each sinc 2 function also has shoulders away from a central peak and/or central inflection point, and processor 120 can be configured to ignore these shoulders. Alternatively, rather than determine the peak and/or inflection point of the respective curve 301, processor 120 can find a maximum of the respective curve 301 and/or processor 120 can use a combination of both techniques.

The peak and/or inflection point of each curve 301 represents a temperature and corresponding power where laser input to PPLN crystal 103 is most efficiently converted to laser output and/or where a contribution of the laser input to heating PPLN crystal 103 is at a minimum.

Figure 4:
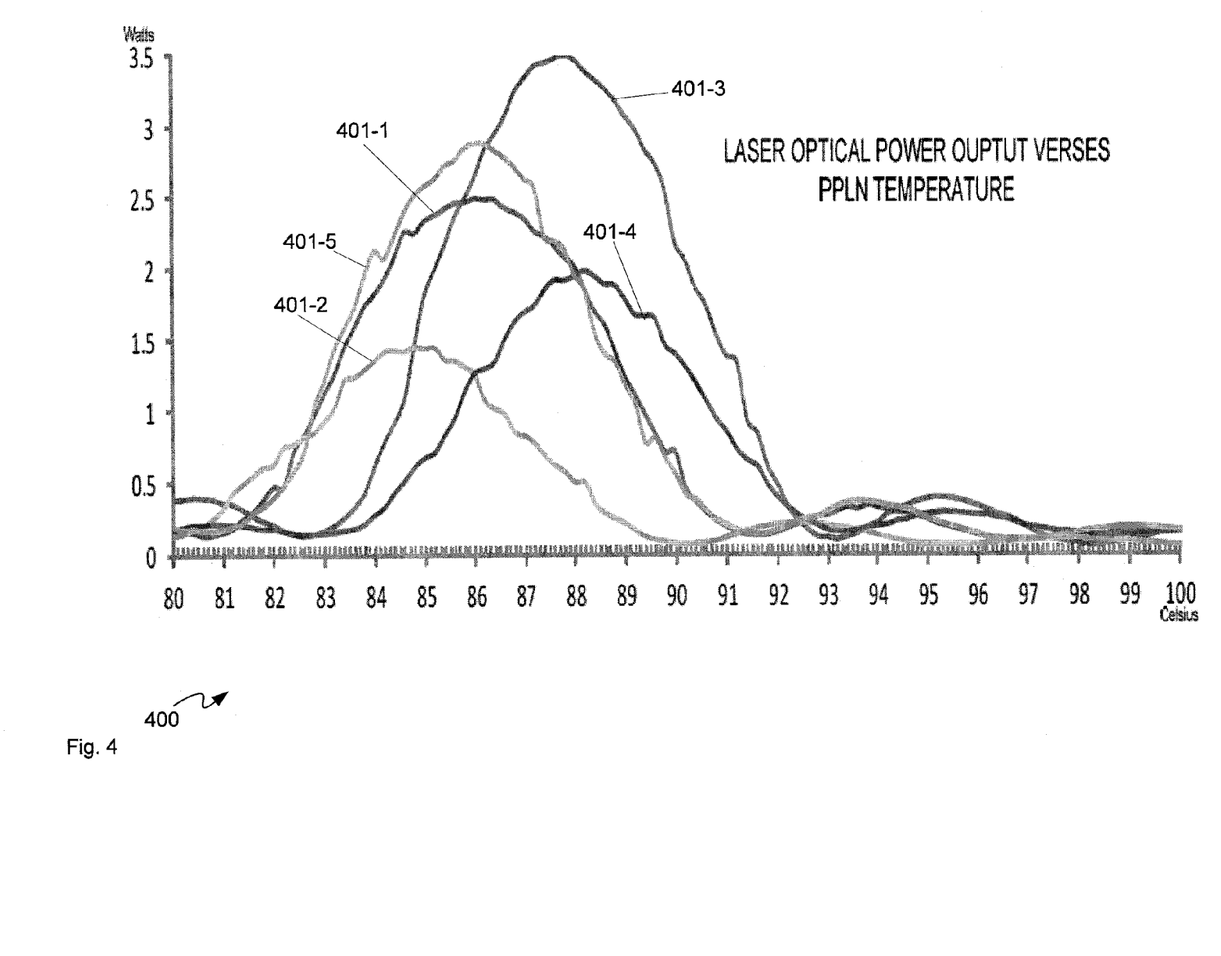
FIG. 4 depicts laser output power vs. PPLN crystal temperature curves for the five different ECSEL laser systems of FIG. 2, according to non-limiting implementations.

For example, attention is next directed to FIG. 4 which depicts a graph 400 of curves 401-1, 401-2, 401-3, 401-4, 401-5 of output laser power of system 100 as a function of temperature of PPLN crystal 103, for each of the five different ECSEL systems of FIGS. 2 and 3. In other words, laser output power was measured at output coupler 113 as the temperature of PPLN crystal 103 was scanned through about 80° C. to about 100° C., similar to curves 201, 301.

Hence, each curve 401-1, 401-2, 401-3, 401-4, 401-5 corresponds, respectively, to curves 201-1, 201-2, 201-3, 201-4, 201-5 of FIG. 2 and curves 301-1, 301-2, 301-3, 301-4, 301-5 of FIG. 3. Curves 401-1, 401-2, 401-3, 401-4, 401-5 will be interchangeably referred to hereafter, collectively, as curves 401 and generically as a curve 401. Analysis on each of curves 401 show that each curve 401 also comprises a sinc 2 function (e.g. $(\sin(x)/x)^2$, where x is one or more of temperature and a function of temperature). Further, the peak and/or inflection point of each curve 401 corresponds to a temperature of PPLN crystal 103 where laser output of system 100 is at a maximum.

Comparing curves 401 with respective curves 301, there is a correspondence between a temperature of respective peaks of each curve 401 and respective peaks of each corresponding curve 301, within about less than 1° C.

Hence, by changing the temperature of PPLN crystal 103 to find the peak and/or inflection point of a function of slope-corrected power vs. temperature (e.g. a range that includes a previously determined operating temperature of PPLN crystal 103), the most efficient operating temperature of PPLN crystal 103 can be determined, as well as the corresponding operating conditions (e.g. power output of power supply 134) of temperature control device 105.

For example, processor 120 can determine the point on a function of a slope-corrected power vs. temperature where the slope is zero, and/or where an inflection point occurs in the function of a slope-corrected power vs. temperature, and/or a maximum of the function, presuming the portions of each curve 301 away from each respective peak are ignored: in other words, each sinc 2 function also has shoulders away from a central peak and/or central inflection point, and processor 120 can be configured to ignore these shoulders.

PPLN crystal 103 can then be operated at the temperature of the peak and/or inflection point and/or maximum of a function of slope-corrected power vs. temperature during operation of system 100.

Furthermore, the temperature of PPLN crystal 103 can continue to be monitored at operating conditions of temperature control device 105 that correspond to the peak and/or inflection point of a function of slope-corrected power vs. temperature. If the temperature of PPLN crystal 103 starts to drift, then the temperature of PPLN crystal 103 can again be changed to determine whether the peak and/or inflection point of a function of slope-corrected power vs. temperature has drifted. For example, if the temperature of PPLN crystal 103 starts to drift, one or more of dithering and/or sweeping about the peak and/or the inflection point of the function of the slope-corrected power vs. temperature can occur. In some of these implementations, the peak and/or inflection point can be monitored periodically by performing periodic changing and/or dithering and/or sweeping of the temperature. Drifting can occur when a wavelength of laser 101 varies with time and/or drifts, and/or the physical properties of PPLN crystal 103 change with time so that the periodicity of PPLN crystal 103 is no longer in tune with the wavelength of laser 101.

Figure 5:
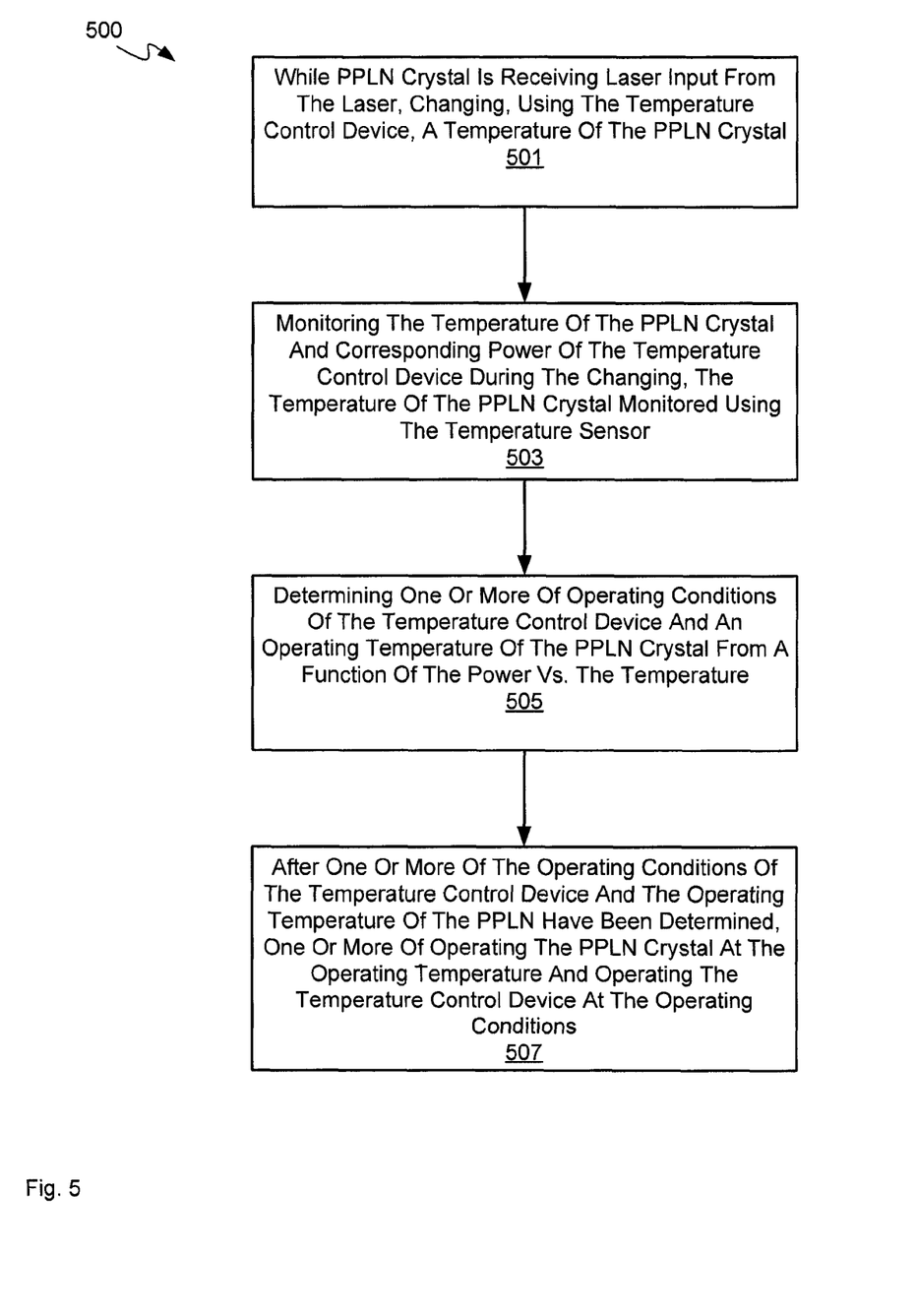
FIG. 5 depicts a method for determining operating conditions of a PPLN crystal in a laser system, according to non-limiting implementations.

Attention is now directed to FIG. 5 which depicts a flowchart illustrating a method 500 for determining operating conditions of a periodically poled lithium niobate crystal in a laser system, according to non-limiting implementations. In order to assist in the explanation of method 500, it will be assumed that method 500 is performed using computing device 109. Furthermore, the following discussion of method 500 will lead to a further understanding of computing device 109 and its various components. However, it is to be understood that computing device 109 and/or method 500 can be varied, and need not work exactly as discussed herein in conjunction with each other, and that such variations are within the scope of present implementations. It is appreciated that, in some implementations, method 500 is implemented in computing device 109 by processor 120, for example by implementing application 145.

It is to be emphasized, however, that method 500 need not be performed in the exact sequence as shown, unless otherwise indicated; and likewise various blocks may be performed in parallel rather than in sequence; hence the elements of method 500 are referred to herein as "blocks" rather than "steps". It is also to be understood that method 500 can be implemented on variations of computing device 109 as well.

It is further appreciated method 500 can be implemented in system 100 comprising: laser 101; PPLN crystal 103 configured to receive laser input from laser 101; temperature control device 105 configured to adjust temperature of PPLN crystal 103; temperature sensor 107 configured to monitor the temperature of the PPLN crystal; and computing device 109. However, method 500 could be implemented in a similar system with similar components to system 100, but arranged in a different configuration. For example, temperature control device 105 and temperature sensor 107 could be integrated with PPLN crystal 103 as PPLN control circuits.

At block 501, while PPLN crystal 103 is receiving laser input from laser 101, computing device 109 changes, using temperature control device 105, a temperature of PPLN crystal 103. Block 501 can include, but is not limited to changing the temperature by one or more of: dithering the temperature about a given temperature; and sweeping the temperature through a given range. While not depicted method 500 can further comprise determining one or more of the given temperature and the given range from one or more of: factory settings for the PPLN crystal; a previous operating temperature of the PPLN crystal; and, previous operating conditions for the temperature control device.

In other words, when a previous operating temperature of temperature control device is known and, for example, stored at memory 122, processor 120 can one or more of: dither the temperature of PPLN crystal 103 about the previous operating temperature, for example by changing the temperature in discreet steps about the previous operating temperature to determine a changed position of the peak and/or inflection point; and sweep PPLN crystal 103 through a range that includes the previous operating temperature plus and minus a given amount, for example 10-20° C. on either side of the previous operating temperature. The determination of the given temperature and/or the given range can alternately be determined from a previous operating power of temperature control device 105. Furthermore, the changing can occur in steps or continuously and/or from a low temperature to a higher temperature or from a higher temperature to a lower temperature (presuming that temperature control device 105 can also cool PPLN crystal 103 from a higher temperature to a lower temperature). Indeed, the changing can occur in any manner where monitoring of the temperature of PPLN crystal 103 and monitoring of corresponding power of temperature control device 105 can also occur.

At block 503, computing device 109 monitors the temperature of PPLN crystal 103 and corresponding power of temperature control device 105 during the changing, the temperature of PPLN crystal 103 monitored using temperature sensor 107. In other words, blocks 501 and 503 can occur in parallel and/or concurrently.

At block 505, computing device 109 determines one or more of operating conditions of temperature control device 105 and an operating temperature of PPLN crystal 103 from a slope of a function of the power vs. the temperature. As described above the function can comprise a slope corrected function of the power vs. the temperature, a constant trend (e.g. the trend lines from FIG. 2) for heating PPLN crystal 103 one or more of separated and subtracted from the power vs. the temperature, as in FIG. 3.

For example block 505 can comprise: one or more of separating and subtracting the constant trend for heating PPLN crystal 103 from the power vs. the temperature to produce slope-corrected power vs. temperature function, as in FIG. 3; and, finding a peak and/or inflection point in the slope of the slope-corrected power vs. temperature data, the operating conditions of temperature control device 105 and the operating temperature corresponding to the peak and/or inflection point, as in FIG. 3. Alternatively, the peak can be determined by determining a maximum of the slope-corrected power vs. temperature function. As described above, the function can comprise a sinc 2 function. The data for the constant trend can be stored at memory 122 to be used in further monitoring of the temperature of PPLN crystal 103, as described below. The separating and/or subtracting can comprise subtracting the linear constant trend line of each curve 201 in FIG. 2 to arrive at curves 301 of FIG. 3. Separating and/or subtracting can also occur using deconvolution techniques.

However, in other implementations, the raw data, as in FIG. 2, can be used to determine one or more of operating conditions of temperature control device 105 and an operating temperature of PPLN crystal 103. With reference to FIGS. 2 and 3, the peaks of curves 301, having a zero slope (and/or where an inflection point occurs and/or where a maximum occurs), approximately correspond to respective points on the bulges of curves 201 that have a slope similar to a slope of the trend lines. However, the correspondence is not exact and the respective points on the bulges of curves 201 that have a slope similar to a slope of the trend lines can be a few degrees from the peak and/or inflection point of the slope-corrected data of FIG. 3. Hence, a point on a bulge of a curve of power vs. temperature that is similar to the slope of the trend line can be used to determine approximately the optimum temperature and corresponding operating conditions.

Further, the function of power vs. temperature can be represented in terms of respective data that is proportional to power and temperature. In other words, processor 120 can be configured to output a value to power supply 134 that corresponds to a given power, for example on a scale of 0 to 255, but that need not directly represent power in Watts. Similarly, temperature sensor 107 can output values that correspond to given respective temperatures, but that need not directly represent temperature on a temperature scale, for example a signal that can be converted to temperature using scaling factors. Hence, the function of power vs. temperature can be represented in terms of one or more of such values.

It is yet further appreciated that processor 120 need not produce curves 201, 301, either physically and/or memory and/or in a cache; rather monitoring a function of power vs. temperature can occur using registers at processor 120 and/or computing techniques.

At block 507, after one or more of the operating conditions of temperature control device 105 and the operating temperature of PPLN crystal 103 have been determined, computing device 109 can one or more of operate PPLN crystal 103 at the operating temperature and operate temperature control device 105 at the operating conditions. For example, method 500 can be implemented to automatically determine the operating conditions where laser output of system 100 is optimized and then operate system 100 under the automatically determined conditions.

Thereafter, computing device 109 can: continue to monitor the temperature of PPLN crystal 103 and the corresponding power of temperature control device 105, and continue to determine the slope of a function of the power vs. the temperature; and, when the slope of the function changes from a pre-determined slope, adjusting one or more of the operating conditions of temperature control device 105 and the temperature of PPLN crystal 103 until the slope changes back to the pre-determined slope. For example, as described above, the function can comprises a slope corrected function of the power vs. the temperature, a constant trend for heating PPLN crystal 103 one or more of separated and subtracted from the power vs. the temperature; data from a previously stored constant trend, for example a constant trend determined at block 505, and stored at memory 122. Hence, the pre-determined slope can comprise a zero slope, as the slope of a peak and/or inflection point of the above described sinc 2 function is also zero. However, in other implementations, the raw data, as in FIG. 2, can be used, and a pre-determined slope of a curve of power vs. temperature, as in FIG. 2, which corresponds to a peak and/or inflection point in FIG. 3, can be used to avoid one or more of separating and subtracting the constant trend. For example, a point on a bulge of a curve of power vs. temperature that is similar to the slope of the trend line can be used to at least approximately determine the optimum temperature and corresponding operating conditions.

Hence, the process of determining an operating temperature of a PPLN crystal can be automated as electrical characteristics of PPLN control circuits (e.g. temperature control device 105) change in a detectable manner in and about an optimal optical power output of laser 101. In the process of heating PPLN crystal 103, the power input is a fixed slope linear relationship to PPLN temperature in the absence of frequency doubling, and the like, at PPLN crystal 103. Further, this characteristic is generally constant for all laser systems that include a PPLN crystal within a particular device model. The offset on the power can be dependent on the laser temperature and laser power dissipation. PPLN frequency doubling varies as a sinc 2 function with PPLN temperature which translates into an optical power output that is also modulated as a sinc 2 function. When PPLN crystal temperature is such that there is no optical power output, the power which is not emitted by the laser becomes additional power dissipated within the laser device which raises the internal temperature. This increase in temperature relates to a decrease in power used to heat PPLN crystal 103 at a specific PPLN temperature. When the optical power of laser 101 is at a maximum, the power required to heat PPLN crystal 103 increases. Since this relation exists, the power used to heat PPLN crystal 103 is modulated by the same sinc 2 function as is the optical power output which then can be used to identify the maximum optical output. By one or more of separating and subtracting the constant power used to heat PPLN crystal 103 from the total power being supplied to temperature control device 105 (e.g. a heater circuit) for PPLN crystal 103, the modulating power sinc 2 function can be revealed which then can be used to identify the temperature for maximum optical power output by measuring the PPLN temperature at maximum peak power of the modulating power sinc 2 function of temperature control device 105.

Those skilled in the art will appreciate that in some implementations, the functionality of computing device 109 can be implemented using pre-programmed hardware or firmware elements (e.g., application specific integrated circuits (ASICs), electrically erasable programmable read-only memories (EEPROMs), etc.), or other related components. In other implementations, the functionality of computing device 109 can be achieved using a computing apparatus that has access to a code memory (not shown) which stores computer-readable program code for operation of the computing apparatus. The computer-readable program code could be stored on a computer readable storage medium which is fixed, tangible and readable directly by these components, (e.g., removable diskette, CD-ROM, ROM, fixed disk, USB drive). Furthermore, it is appreciated that the computer-readable program can be stored as a computer program product comprising a computer usable medium. Further, a persistent storage device can comprise the computer readable program code. It is yet further appreciated that the computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A method comprising:
   in a system comprising: a laser; a periodic poled lithium niobate (PPLN) crystal configured to receive laser input from the laser; a temperature control device configured to adjust the temperature of the PPLN crystal; a temperature sensor configured to monitor the temperature of the PPLN crystal; and a computing device:
      while the PPLN crystal is receiving laser input from the laser, changing, using the temperature control device, a temperature of the PPLN crystal;
      monitoring, at the computing device, the temperature of the PPLN crystal and corresponding power of the temperature control device during the changing, the temperature of the PPLN crystal monitored using the temperature sensor; and,
      determining, at the computing device, one or more of operating conditions of the temperature control device and an operating temperature of the PPLN crystal from a function of the power vs. the temperature, the function comprising a slope corrected function of the power vs. the temperature, a constant trend for heating the PPLN crystal one or more of separated and subtracted from the power vs. the temperature.

2. The method of claim 1, wherein determining one or more of the operating conditions of the temperature control device and the operating temperature of the PPLN crystal from the function of the power vs. the temperature comprises:
   one or more of separating and subtracting the constant trend for heating the PPLN crystal from the power vs. the temperature to produce slope-corrected power vs. temperature data; and,
   finding one or more of a peak, a maximum and an inflection point in a slope of the slope-corrected power vs. temperature data, the operating conditions of the temperature control device and the operating temperature corresponding to one or more of the peak, the maximum, and the inflection point.

3. The method of claim 1, wherein the function comprises a sinc 2 function.

4. The method of claim 1, further comprising:
   after one or more of the operating conditions of the temperature control device and the operating temperature of the PPLN crystal have been determined, one or more of operating the PPLN crystal at the operating temperature and operating the temperature control device at the operating conditions.

5. The method of claim 4, further comprising:
   continuing to monitor the temperature of the PPLN crystal and the corresponding power of the temperature control device, and continuing to determine the function of the power vs. the temperature; and,
   when a slope of the function changes from a pre-determined slope, adjusting one or more of the operating conditions of the temperature control device and the temperature of the PPLN crystal until the slope changes back to the pre-determined slope.

6. The method of claim 5, wherein the function comprises a slope corrected function of the power vs. the temperature, a constant trend for heating the PPLN crystal one or more of separated and subtracted from the power vs. the temperature, and the pre-determined slope comprises a zero slope.

7. The method of claim 1, wherein the changing the temperature comprises one or more of: dithering the temperature about a given temperature; and sweeping the temperature through a given range.

8. The method of claim 7, further comprising determining one or more of the given temperature and the given range from one or more of:
   factory settings for the PPLN crystal;
   a previous operating temperature of the PPLN crystal; and,
   previous operating conditions for the temperature control device.

9. A system comprising:
   a laser; a periodic poled lithium niobate (PPLN) crystal configured to receive laser input from the laser; a temperature control device configured to adjust the temperature of the PPLN crystal; a temperature sensor configured to monitor the temperature of the PPLN crystal; and, a computing device configured to:
   while the PPLN crystal is receiving laser input from the laser, change, using the temperature control device, a temperature of the PPLN crystal;
   monitor the temperature of the PPLN crystal and corresponding power of the temperature control device during changing of the temperature, the temperature of the PPLN crystal monitored using the temperature sensor; and,
   determine one or more of operating conditions of the temperature control device and an operating temperature of the PPLN crystal from a function of the power vs. the temperature, the function comprising a slope corrected function of the power vs. the temperature, a constant trend for heating the PPLN crystal one or more of separated and subtracted from the power vs. the temperature.

10. The system of claim 9, wherein the computing device is further configured to determine one or more of the operating conditions of the temperature control device and the operating temperature of the PPLN crystal from the function of the power vs. the temperature by:
   one or more of separating and subtracting the constant trend for heating the PPLN crystal from the power vs. the temperature to produce slope-corrected power vs. temperature data; and,
   finding one or more of a peak, a maximum, and an inflection point in a slope of the slope-corrected power vs. temperature data, the operating conditions of the temperature control device and the operating temperature corresponding to one or more the peak, the maximum, and the inflection point.

11. The system of claim 9, wherein the function comprises a sinc 2 function.

12. The system of claim 9, wherein the computing device is further configured to:
   after one or more of the operating conditions of the temperature control device and the operating temperature of the PPLN crystal have been determined, one or more of operate the PPLN crystal at the operating temperature and operate the temperature control device at the operating conditions.

13. The system of claim 12, wherein the computing device is further configured to:
   continue to monitor the temperature of the PPLN crystal and the corresponding power of the temperature control device, and continue to determine the function of the power vs. the temperature; and,
   when a slope of the function changes from a pre-determined slope, adjust one or more of the operating conditions of the temperature control device and the temperature of the PPLN crystal until the slope changes back to the pre-determined slope.

14. The system of claim 13, wherein the function comprises a slope corrected function of the power vs. the temperature, a constant trend for heating the PPLN crystal one or more of separated and subtracted from the power vs. the temperature, and the pre-determined slope comprises a zero slope.

15. The system of claim 9, wherein the computing device is further configured to change the temperature by one or more of: dithering the temperature about a given temperature; and sweeping the temperature through a given range.

16. The system of claim 15, wherein the computing device is further configured to determine one or more of the given temperature and the given range from one or more of:
   factory settings for the PPLN crystal;
   a previous operating temperature of the PPLN crystal; and,
   previous operating conditions for the temperature control device.

17. The system of claim 9, further comprising an output coupler, wherein the laser comprises an extended cavity surface emitting laser, the PPLN crystal located between the laser and the output coupler.

18. A computer program product, comprising a computer usable medium having a non-transitory computer readable program code adapted to be executed to implement a method comprising:
   in a system comprising: a laser; a periodic poled lithium niobate (PPLN) crystal configured to receive laser input from the laser; a temperature control device configured to adjust the temperature of the PPLN crystal; a temperature sensor configured to monitor the temperature of the PPLN crystal:
   while the PPLN crystal is receiving laser input from the laser, changing, using the temperature control device, a temperature of the PPLN crystal;
   monitoring the temperature of the PPLN crystal and corresponding power of the temperature control device during the changing, the temperature of the PPLN crystal monitored using the temperature sensor; and,
   determining one or more of operating conditions of the temperature control device and an operating temperature of the PPLN crystal from a slope of a function of the power vs. the temperature, the function comprising a slope corrected function of the power vs. the temperature, a constant trend for heating the PPLN crystal one or more of separated and subtracted from the power vs. the temperature.

* * * * *